(12) United States Patent
Aihara et al.

(10) Patent No.: US 7,688,076 B2
(45) Date of Patent: Mar. 30, 2010

(54) INSULATION INSPECTION APPARATUS

(75) Inventors: Hiroshi Aihara, Toyota (JP); Jun Fujiki, Echizen (JP); Susumu Kiyohara, Ibaraki (JP)

(73) Assignees: Toyota Jidosha Kabushiki Kaisha, Toyota (JP); Nitto Shinko Corporation, Sakai (JP); Nitto Denko Corporation, Ibaraki (JP)

( * ) Notice: Subject to any disclaimer, the term of this patent is extended or adjusted under 35 U.S.C. 154(b) by 234 days.

(21) Appl. No.: 11/885,053

(22) PCT Filed: Mar. 1, 2006

(86) PCT No.: PCT/JP2006/304425
§ 371 (c)(1),
(2), (4) Date: Aug. 24, 2007

(87) PCT Pub. No.: WO2006/093323
PCT Pub. Date: Sep. 8, 2006

(65) Prior Publication Data
US 2008/0258737 A1    Oct. 23, 2008

(30) Foreign Application Priority Data
Mar. 2, 2005    (JP)    ............ 2005-057657

(51) Int. Cl.
*G01R 31/06* (2006.01)
*G01R 31/12* (2006.01)

(52) U.S. Cl. .................. 324/522; 324/551; 324/546

(58) Field of Classification Search ............ 324/522, 324/551–554, 545–547, 772
See application file for complete search history.

(56) References Cited

U.S. PATENT DOCUMENTS

| 3,775,686 | A | * | 11/1973 | Ganger et al. | ........... 324/546 |
| 5,594,348 | A | * | 1/1997 | Iijima et al. | ........... 324/551 |
| 5,867,029 | A | * | 2/1999 | Iijima et al. | ........... 324/546 |
| 5,907,244 | A | * | 5/1999 | Crabill et al. | ........... 324/546 |
| 7,042,229 | B2 | * | 5/2006 | Lee et al. | ........... 324/551 |
| 2003/0178999 | A1 | * | 9/2003 | Klingel | ........... 324/557 |

FOREIGN PATENT DOCUMENTS

| JP | U 62-81461 | 5/1987 |
| JP | A 64-9360 | 1/1989 |
| JP | A 9-43301 | 2/1997 |
| JP | A 2002-296243 | 10/2002 |
| JP | A 2003-248028 | 9/2003 |
| JP | A 2004-347523 | 12/2004 |
| JP | A 2005-121442 | 5/2005 |

* cited by examiner

*Primary Examiner*—Timothy J Dole
(74) *Attorney, Agent, or Firm*—Oliff & Berridge, PLC

(57) ABSTRACT

An insulation inspection apparatus includes a chamber in which a stator with a winding can be stored, an electrode movable along the outer circumference of a coil end of the stator winding, a voltage application unit applying voltage between the coil end and electrode, a sensor unit sensing leakage current and/or voltage drop between the coil end and electrode, and a pressure reduction unit reducing the pressure in the chamber.

18 Claims, 4 Drawing Sheets

PRESSURE

DISTANCE BETWEEN
DISCHARGING
ELECTRODES

INSULATION INSPECTION APPARATUS

TECHNICAL FIELD

The present invention relates to insulation inspection apparatuses, particularly an insulation inspection apparatus detecting the presence, if any, and location of an insulation defect at a winding by causing discharge at the insulation defective region of the winding.

BACKGROUND ART

The method of detecting an insulation defect at a winding is conventionally known.

For example, Japanese Patent Laying-Open No. 64-9360 discloses the method of detecting the presence and location of a pinhole in a winding by reducing the pressure in a vessel while constant voltage is applied to the winding of the rotating electric machine to cause partial discharge.

Further, Japanese Patent Laying-Open No. 2003-248028 discloses the method of identifying the location of a coil defect by means of a liquid level sensor, including the steps of gradually supplying noncorrosive and conductive inspection liquid into an inspection tank, applying voltage across an electrode and coil to identify the location of the coil defect on the basis of the height of the inspection liquid surface measured by the liquid level sensor at the point of time when electrical conductivity is detected across the electrode and coil.

In addition, Japanese Patent Laying-Open No. 9-43301 discloses an insulation testing method including the steps of applying surge voltage to the coil, and detecting whether glow discharge is generated from the coil or not.

In detecting an insulation defect, identification of the location of the defect, in addition to the presence of such a defect, is important. Although the three documents set forth above disclose identification of a defective region based on a concept different from that of the present invention, none of the approaches are necessarily sufficient from the standpoint of identifying the accurate position.

DISCLOSURE OF THE INVENTION

An object of the present invention is to provide an insulation inspection apparatus that can detect the presence/absence of an insulation defect at a winding, and detect the accurate position thereof.

An insulation inspection apparatus according to the present invention includes an inspection vessel in which a winding can be stored, an electrode provided to face the winding, a voltage application unit applying voltage between the winding and electrode, and a sensor unit sensing current and/or voltage between the winding and electrode. Voltage is applied between the winding and electrode while the relative positional relationship between the winding and electrode is altered.

In accordance with the configuration set forth above, leakage current and/or voltage drop between the winding and electrode can be sensed to detect an insulation defect at the winding. By detecting an insulation defect while altering the relative positional relationship between the winding and electrode, the defective position can be detected accurately.

Preferably, the insulation inspection apparatus further includes a pressure reduction unit reducing pressure in the inspection vessel. The pressure reduction unit preferably sets the pressure in the inspection vessel higher than 0 Pa and not more than 1000 Pa.

By conducting inspection under a pressure-reduced condition, discharge readily occurs between an insulation defective region of the winding and electrode even at a relatively low voltage. By causing discharge at low voltage, the damage on the insulator around the defective region due to discharge can be reduced.

In the insulation inspection apparatus, the electrode faces the coil end of the winding formed at the axial end of the annular core body, by way of example.

Accordingly, an insulation defect at the coil end can be detected accurately.

In the insulation inspection apparatus, the electrode preferably has a shape that facilitates electric field concentration.

The occurrence of electric field concentration allows the discharge initiation voltage between the electrode and winding to be reduced. Therefore, the damage on the insulator around the defective region due to discharge can be reduced.

According to the present invention, the location of an insulation defective region at the winding can be detected accurately.

BEST MODES FOR CARRYING OUT THE INVENTION

Figure 1:
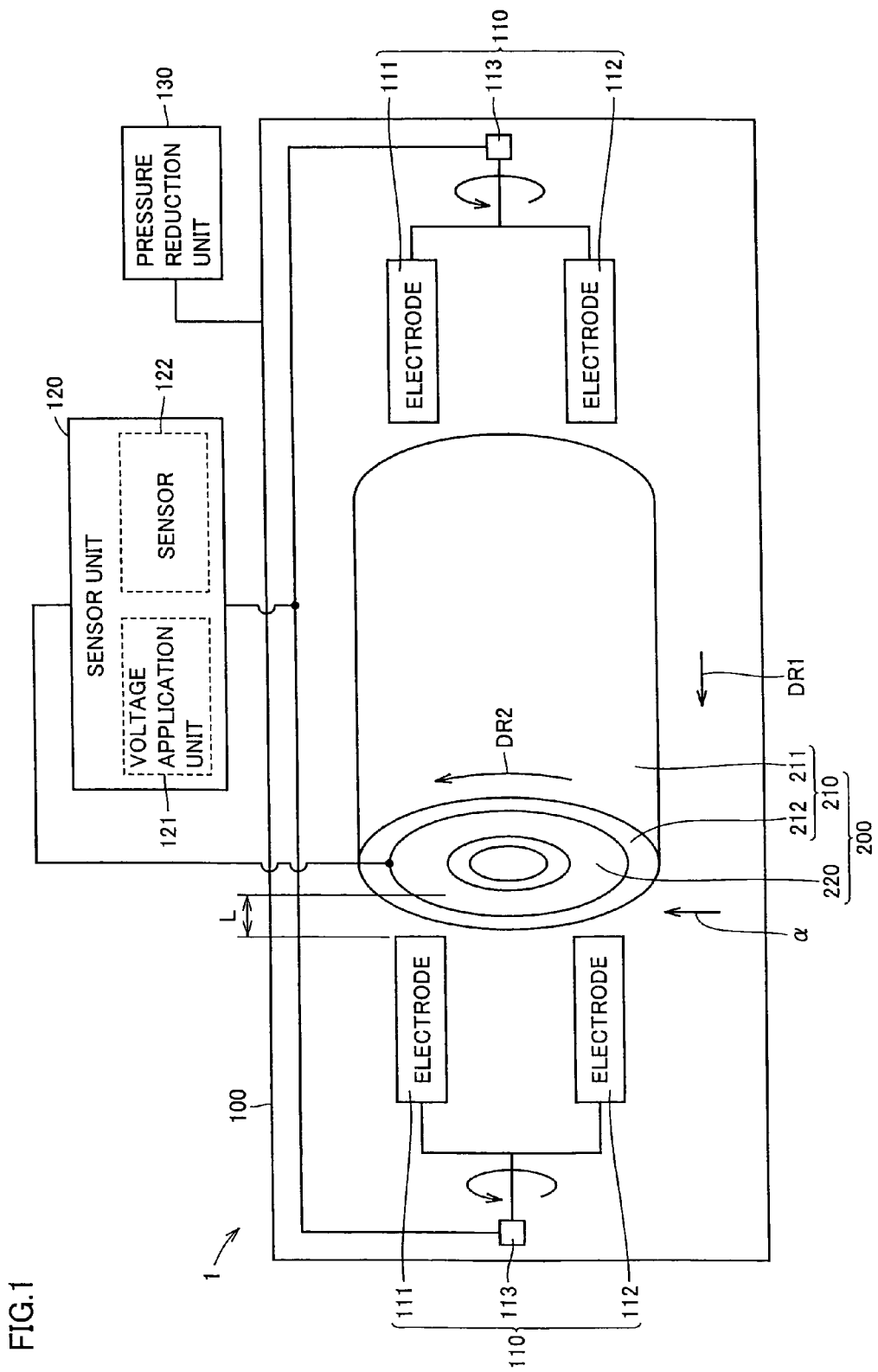
FIG. 1 represents a configuration of an insulation inspection apparatus according to an embodiment of the present invention.

An embodiment of an insulation inspection apparatus according to the present invention will be described hereinafter. The same or corresponding elements have the same reference characters allotted, and description thereof may not be repeated.

FIG. 1 represents a configuration of an insulation inspection apparatus according to an embodiment of the present invention. Referring to FIG. 1, an insulation inspection apparatus 1 of the present embodiment includes a chamber 100 (inspection vessel).

A stator 200 is placed in chamber 100. Stator 200 includes a stator core 210 and a coil end 220.

Plates of a magnetic substance such as iron, iron alloy, and the like are stacked to constitute annular stator core 210. On the inner circumferential face of stator core 210 are formed a plurality of tooth sections (not shown) and a slot section (not shown) qualified as a recess between the teeth. The slot section is formed to open at the inner circumferential side of stator core 210.

The three-phase winding of an U phase, V phase and W phase is wound along the tooth section so as to fit in the slot section. The U phase winding, V phase winding and W phase winding are wound in a manner deviated from each other on the circumference.

Stator core 210 includes a cylindrical face 211 and an axial end face 212. Coil end 220 of the winding is located on either axial end face 212 of stator core 210. The wire constituting the winding including coil end 220 is coated with an insulative film.

If a pinhole or crack is generated at the insulation film on the wire constituting the winding to expose the inner conductor, insulation between the phases will be degraded. In accordance with insulation inspection apparatus 1 based on the configuration that will be described afterwards, the presence of an insulation defect, if any, and position thereof can be detected accurately. As a result, appropriate measures can be taken with respect to generation of an insulation defect.

A detection method of an insulation defect by insulation inspection apparatus 1 will be described. As shown in FIG. 1, insulation inspection apparatus 1 includes a defect probe unit 110, a sensor unit 120, and a pressure reduction unit 130. Defect probe unit 110 includes electrodes 111 and 112 provided to sandwich the core in the axial direction of stator core 210 (direction of arrow DR1), having a gap of L from coil end 220, and a rotation drive unit 113 rotating the electrodes in the circumferential direction of stator core 210 (direction of arrow DR2). Sensor unit 120 includes a voltage application unit 121 applying voltage between electrodes 111 and 112 and the winding, and a sensor 122 sensing current and/or voltage between electrodes 111 and 112 and the winding. Pressure reduction unit 130 reduces the pressure in chamber 100.

In the operation of insulation inspection, rotation drive unit 113 is actuated while voltage is applied between electrodes 111 and 112 and the winding to move electrodes 111 and 112 along the direction of arrow DR2. At the same time, the current and/or voltage between electrodes 111 and 112 and the winding is sensed.

When there is an insulation defect at coil end 220, discharge occurs between coil end 220 and electrodes 111 and 112 to cause leakage current. This leakage current can be sensed by sensor 122 of sensor unit 120. In the case where this leakage current is great, voltage drop between electrodes 111 and 112 and the winding can also be sensed by sensor 122. Determination can be made of the presence/absence of an insulation defect by sensing leakage current or voltage drop. Further, by conducting detection of an insulation defect while electrodes 111 and 112 are moved in the circumferential direction of stator core 210, the location of the relevant defective region in the circumferential direction (direction of arrow DR2) can be identified.

Insulation inspection can be conducted in a manner similar to that described above even if only one of electrodes 111 and 112 is provided. The time required for inspection can be shortened by providing the plurality of electrodes deviated from each other in the circumferential direction of coil end 220, as shown in FIG. 1. Additionally, in the case where there are a plurality of electrodes and the inspection time is set equal to that carried out by one electrode, the rotational speed of the electrodes can be reduced to improve the inspection accuracy (accuracy in identifying the defective position). For example, since the embodiment of FIG. 1 has two electrodes 111 and 112 deviated from each other by 180° in the direction of arrow DR2, the time required for inspection can be shortened to half based on the same rotational speed setting of the electrode as compared to the case where only one electrode is disposed. Further, if the inspection time is set equal to that carried out by one electrode, the rotational speed of the electrodes can be reduced to half. Accordingly, the inspection accuracy (accuracy in identifying the defective position) can be improved.

Identification of the position of an insulation defect is typically effected by visual confirmation of the occurrence of discharge while electrodes 111 and 112 are moved. Accordingly, the insulation region can be identified accurately while suppressing increase in cost. Identification of the position of an insulation defect may also be made by incorporating an infrared thermometer at chamber 100, or by analyzing a video image corresponding to the inspection procedure by means of an image processor to identify the discharge region. These means are advantageous in that the position can be identified with higher accuracy.

Figure 2:
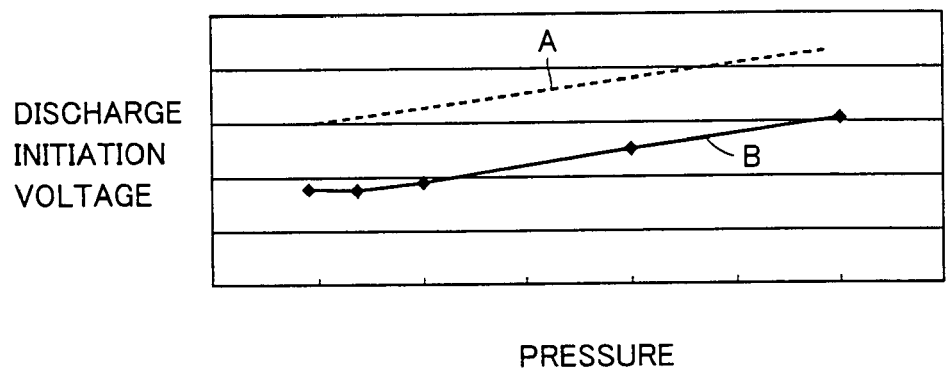
FIG. 2 represents the relationship between the pressure in the inspection vessel and discharge initiation voltage.

FIG. 2 represents the relationship between the pressure in the inspection vessel and the discharge initiation voltage (the voltage required to initiate discharge at the defective region). In FIG. 2, A represents the result by simulation, and B represents the results of experiments carried out with insulation inspection apparatus 1. It is appreciated from A and B in FIG. 2 that the discharge initiation voltage is reduced as the pressure in the inspection vessel becomes lower. In other words, by reducing the pressure in the inspection vessel, discharge can be initiated even by a relatively low voltage to allow sensing of an insulation defect. By the occurrence of discharge at low voltage, the damage on the insulator around the defective region due to discharge can be reduced.

In insulation inspection apparatus 1 shown in FIG. 1, the pressure in chamber 100 subsequent to pressure reduction by pressure reduction unit 130 can be altered appropriately. Specifically, the pressure is possibly set to the level of 1000 Pa or below (preferably, in the range of at least 200 Pa and not more than 800 Pa (for example, at least 200 Pa and not more than 270 Pa ($\approx$2 Torr)). By a pressure in this range, the advantage set forth above can be provided sufficiently.

Figure 3:
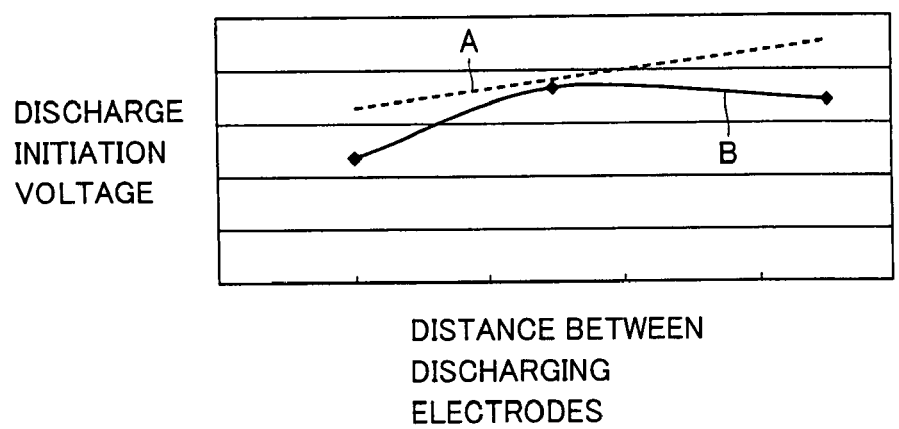
FIG. 3 represents the relationship of the distance between the discharging electrodes and discharge initiation voltage.

FIG. 3 represents the relationship of the distance between the discharging electrodes and discharge initiation voltage. In FIG. 3, A represents the results by simulation, whereas B represents the results of experiments carried out with insulation inspection apparatus 1. In insulation inspection apparatus 1, the distance between the discharging electrodes refers to the gap between electrodes 111 and 112 and coil end 220 (distance L in FIG. 1). It is appreciated from A and B in FIG. 3 that the discharge initiation voltage becomes lower as the distance between the discharging electrodes becomes shorter. Although the results of the experiment carried out with insulation inspection apparatus 1 (B) indicate that the discharge initiation voltage converges to a constant value when the distance between the discharging electrodes is large, this is conceived as an experimental error. It is considered that a trend similar to that of simulation (A) is basically achieved. In other words, by reducing the distance between the discharging electrodes (L), discharge can be generated even with a relatively low voltage to allow sensing of an insulation defect. The occurrence of discharge at low voltage reduces the damage on the insulator around the defective region caused by discharge. Although it is preferable to place electrodes 111 and 112 as close as possible to coil end 220, the distance is modified appropriately in consideration of the concave and convex at coil end 220 in the direction of arrow DR1.

The reason why the discharge initiation voltage in the experiment result "B" carried out with insulation inspection apparatus 1 is lower than the discharge initiation voltage of the result "A" by simulation may be due to the fact that electric field concentration is readily induced by virtue of employing an electrode having a corner in insulation inspection apparatus 1 as compared to employing a flat electrode model in the simulation.

The discharge initiation voltage can be reduced to a low level by causing electric field concentration at the time of discharge. In other words, electrodes 111 and 112 preferably take a shape that facilitates electric field concentration, though appropriate modification thereof is allowed.

Figure 4:
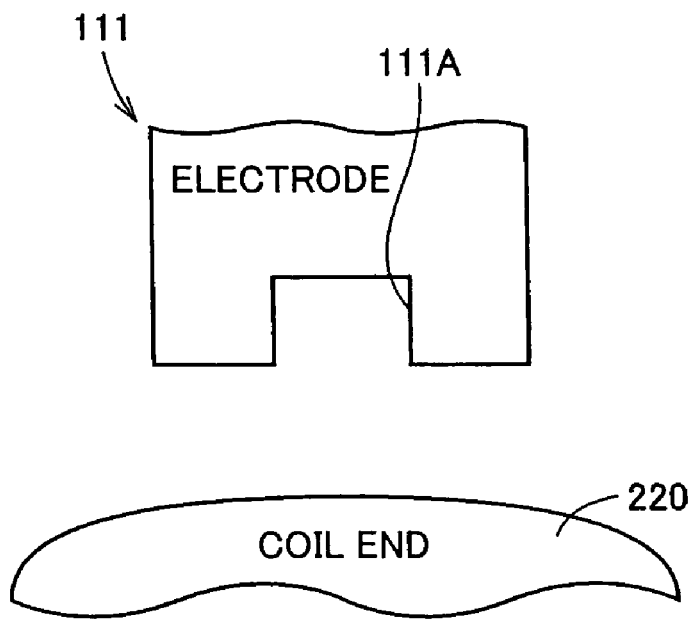
FIG. 4 represents an example of the shape of the electrode, corresponding to the electrode and coil end viewed from the direction of arrow a in FIG. 1.
Figure 5:
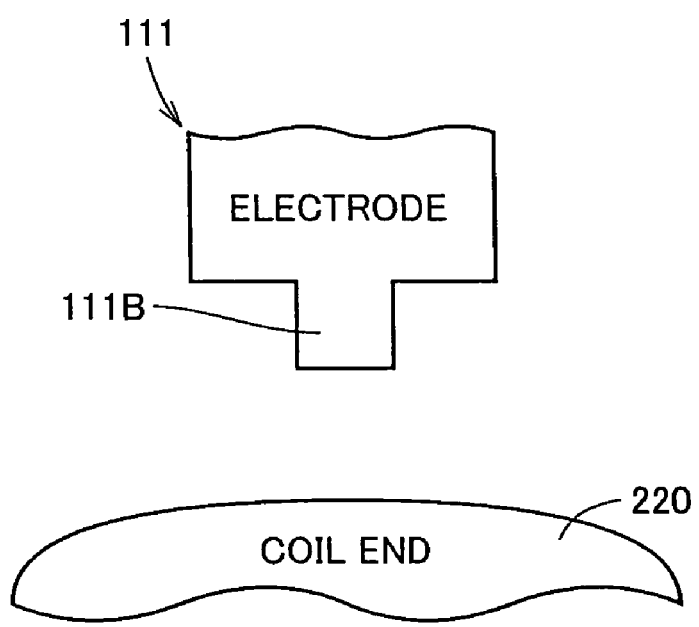
FIG. 5 represents another example of the shape of the electrode, corresponding to the electrode and coil end viewed from the direction of arrow a in FIG. 1.
Figure 6:
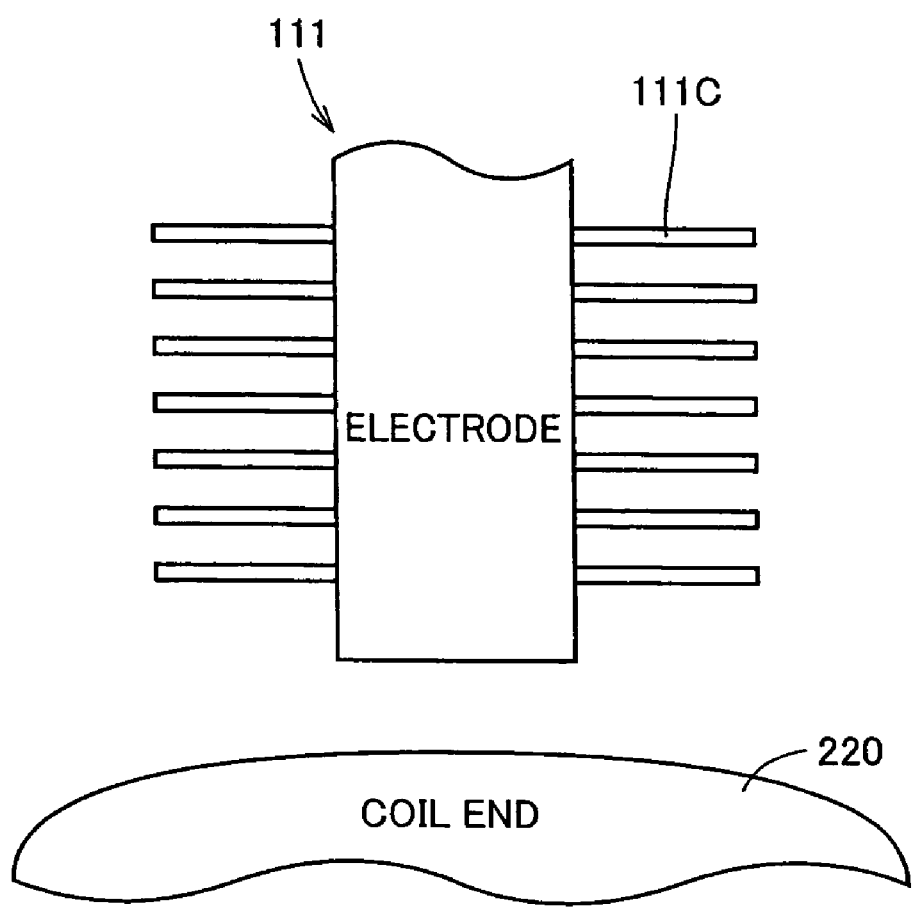
FIG. 6 represents a further example of the shape of the electrode, corresponding to the electrode and coil end viewed from the direction of arrow a in FIG. 1.

FIGS. 4-6 represent examples of the electrode shape directed to facilitating electric field concentration. FIGS. 4-6 correspond to the view of electrodes 111 and 112 and coil end 220 from the direction of arrow α in FIG. 1.

In the example of FIG. 4, electrode 111 has a recess 111A at the region facing coil end 220. Accordingly, the number of corners for electrode 111 increases. As a result, electric field concentration is facilitated during discharging to allow a lower discharge initiation voltage.

In the example of FIG. 5, electrode 111 has a projection 111B at the region facing coil end 220. In the example of FIG. 6, electrode 111 includes a plurality of protrusions protruding from the side. Advantages similar to those of the example of FIG. 4 can be achieved by the examples of FIGS. 5 and 6.

In the insulation inspection, noble gas such as neon or argon can be introduced in chamber 100. Accordingly, the noble gas gives off light when discharging occurs at the insulation defective region to facilitate visual confirmation of the presence of a defect. As a result, the inspection accuracy as well as efficiency can be improved.

In recapitulation, insulation inspection apparatus 1 of the present embodiment includes a chamber 100 (inspection vessel) in which a stator 200 with a winding can be stored, electrodes 111 and 112 provided to face coil end 220 of the stator winding, a voltage application unit 121 applying voltage between the winding and electrodes 111 and 112, a sensor unit 122 sensing the leakage current and/or voltage drop between the winding and electrodes 111 and 112, and a pressure reduction unit 130 reducing the pressure in chamber 100.

When an insulation defect at coil end 220 is to be detected by insulation inspection apparatus 1, voltage is applied between the winding and electrodes 111 and 112 while the relative positional relationship between coil end 220 and electrodes 111 and 112 is altered. The relative positional relationship between coil end 220 and electrodes 111 and 112 can be altered by moving electrodes 111 and 112 along the outer circumference of coil end 220, or by rotating stator 200 such that coil end 220 passes above a fixed electrode. The above description is mainly based on a structure in which electrodes 111 and 112 are rotated. This is advantageous in that the configuration of the apparatus can be rendered simple to allow reduction in the cost or the like since it is easier to rotate electrodes 111 and 112 than rotating stator 200 having windings wound.

It should be understood that the embodiments disclosed herein are illustrative and non-restrictive in every respect. The range of the present invention is defined by the appended claims, and all changes that fall within limits and bounds of the claims, or equivalent thereof are intended to be embraced by the claims.

INDUSTRIAL APPLICABILITY

The present invention is applied to an insulation inspection apparatus.

The invention claimed is:

1. An insulation inspection apparatus comprising:
an inspection vessel in which a winding can be stored,
an electrode provided to face a coil end of said winding formed at an axial end of an annular core body,
a voltage application unit applying voltage between said winding and said electrode, and
a sensor unit sensing current and/or voltage between said winding and said electrode, wherein
voltage is applied between said winding and said electrode while a relative positional relationship between said winding and said electrode is altered, and
a predetermined gap is formed between said winding and said electrode, wherein said predetermined gap is an axial gap between said winding and said electrode.

2. The insulation inspection apparatus according to claim 1, further comprising a pressure reduction unit reducing pressure in said inspection vessel.

3. The insulation inspection apparatus according to claim 2, wherein said pressure reduction unit sets the pressure in said inspection vessel higher than 0 Pa and not more than 1000 Pa.

4. The insulation inspection apparatus according to claim 1, wherein said electrode is shaped as two protruding members and a rectangular gap defined therebetween.

5. The insulation inspection apparatus according to claim 1, wherein said electrode is shaped as a rectangular protrusion.

6. The insulation inspection apparatus according to claim 1, wherein said electrode is shaped with a plurality of extending portions on a side region of said electrode.

7. The insulation inspection apparatus according to claim 1, wherein the inspection vessel defines a housing for the winding.

8. The insulation inspection apparatus according to claim 1, wherein the electrode is capable of receiving a voltage and detecting a voltage drop between the winding and the electrode.

9. The insulation inspection apparatus according to claim 1, wherein the electrode is external to the winding.

10. An insulation inspection apparatus comprising:
an inspection vessel in which a winding can be stored,
an electrode provided to face a coil end of said winding formed at an axial end of an annular core body,
voltage application means for applying voltage between said winding and said electrode, and
sensor means for sensing current and/or voltage between said winding and said electrode, wherein
voltage is applied between said winding and said electrode while a relative positional relationship between said winding and said electrode is altered, and
a predetermined gap is formed between said winding and said electrode, wherein said predetermined gap is an axial gap between said winding and said electrode.

11. The insulation inspection apparatus according to claim 10, further comprising pressure reduction means for reducing pressure in said inspection vessel.

12. The insulation inspection apparatus according to claim 11, wherein said pressure reduction means sets the pressure in said inspection vessel higher than 0 Pa and not more than 1000 Pa.

13. The insulation inspection apparatus according to claim 10, wherein said electrode is shaped as two protruding members and a rectangular gap defined therebetween.

14. The insulation inspection apparatus according to claim 10, wherein said electrode is shaped as a rectangular protrusion.

15. The insulation inspection apparatus according to claim 10, wherein said electrode is shaped with a plurality of extending portions on a side region of said electrode.

16. The insulation inspection apparatus according to claim 10, wherein the inspection vessel defines a housing for the winding.

17. The insulation inspection apparatus according to claim 10, wherein the electrode is capable of receiving a voltage and detecting a voltage drop between the winding and the electrode.

18. The insulation inspection apparatus according to claim 10, wherein the electrode is external to the winding.

* * * * *